(12) United States Patent
Furukawa

(10) Patent No.: US 6,417,678 B2
(45) Date of Patent: *Jul. 9, 2002

(54) BRIDGE CIRCUIT FOR DETECTOR

(75) Inventor: Masanao Furukawa, Kyoto (JP)

(73) Assignee: Shimadzu Corporation, Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/361,457

(22) Filed: Jul. 27, 1999

(30) Foreign Application Priority Data

Sep. 10, 1998 (JP) ............................................. 10-257160

(51) Int. Cl.$^7$ ............................................... G01R 27/08
(52) U.S. Cl. ...................................................... 324/721
(58) Field of Search ........................... 324/721; 363/21, 363/97, 144, 147; 73/755, 753, 756, 862.69, 765, 779; 374/164, 32

(56) References Cited

U.S. PATENT DOCUMENTS

| | | | | |
|---|---|---|---|---|
| 4,798,093 A | * | 1/1989 | Kenoun | ........................ 73/708 |
| 6,015,234 A | * | 1/2000 | Gourrier et al. | ............. 374/164 |

\* cited by examiner

*Primary Examiner*—N. Le
*Assistant Examiner*—Etienne P LeRoux
(74) *Attorney, Agent, or Firm*—Beyer Weaver & Thomas LLP

(57) ABSTRACT

A bridge circuit serving as a detector of a physical variable such as pressure has four resistors forming a wheatstone bridge, one of the resistors changing resistance according to variations in the physical variable to be measured. Voltage difference between a mutually opposite pair of junctions of the four resistors is measured by one circuit and that between the other mutually opposite pair of junctions is measured by another circuit. The effect of temperature variation is calculated from these measured values to reduce the drift in the value of pressure calculated from the voltage imbalance of the wheatstone bridge.

7 Claims, 1 Drawing Sheet

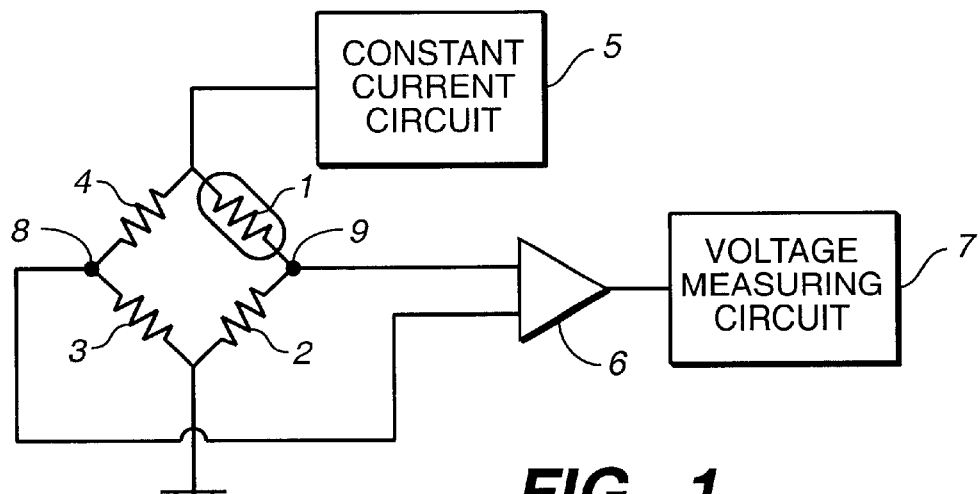
FIG._1
*(PRIOR ART)*
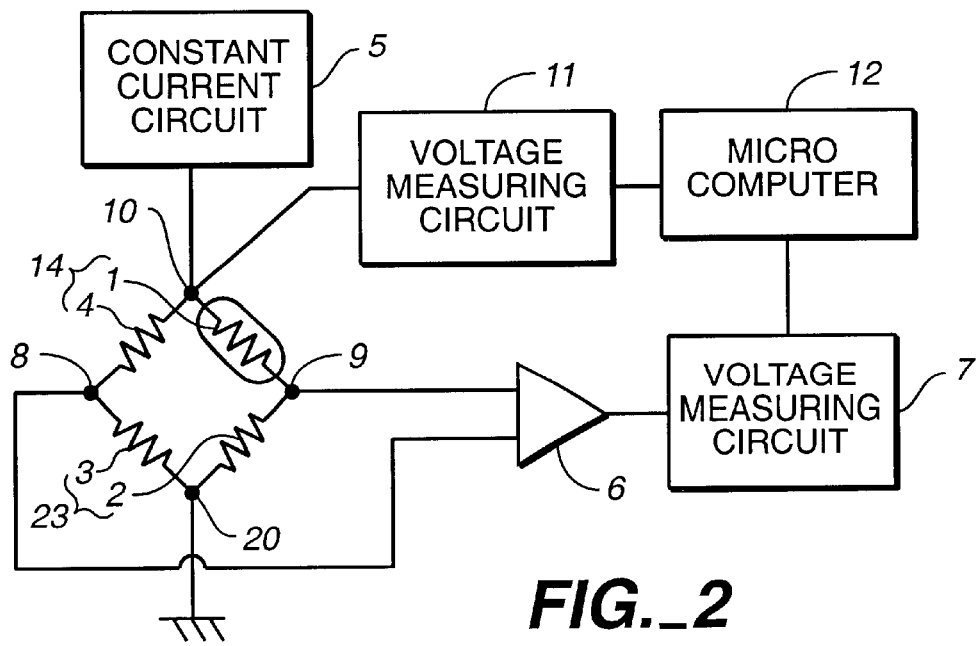
FIG._2

US 6,417,678 B2

BRIDGE CIRCUIT FOR DETECTOR

BACKGROUND OF THE INVENTION

This invention relates to a bridge circuit serving as a part of a detector. More particularly, the invention relates to a bridge circuit with reduced drift due to variations in the environmental temperature and detectors of various kinds incorporating such a bridge circuit.

It has been known to make use of the changes in the resistance of a resistor according to variations in various measurable physical quantities such as pressure, temperature and degree of vacuum in forming a bridge circuit by using such a resistor, as well as to provide detectors of various kinds, such as pressure sensors and detectors of thermal conductivity for a gas chromatograph, a strain gauge, a vacuum gauge or a temperature detector, for detecting physical variables by using such a circuit.

FIG. 1 shows the structure of a pressure sensor of a gas chromatograph, as an example of detector using such a bridge circuit including a pressure-sensitive resistor 1 enclosed inside a sealed vessel into which a gas can be introduced to have its pressure measured. This pressure-sensitive resistor 1 is connected with three other resistors 2, 3 and 4 to together form a quadrangle. A constant current circuit 5 is connected to the junction between the resistors 1 and 4, an amplifier circuit 6 has one of its input terminals connected to the junction indicated by numeral 9 between the resistors 1 and 2 and the other of its input terminals connected to the junction indicated by numeral 8 between the resistors 3 and 4, and a voltage measuring circuit 7 is connected to the output terminal of the amplifier circuit 6. The constant current circuit 5 is for passing a constant current of several mA through the resistors 1, 2, 3 and 4 forming a Wheatstone bridge and the voltage difference between the two voltage measurement points 8 and 9 is amplified by the amplifier circuit 6 and detected by the voltage measuring circuit 7.

The pressure-sensitive resistor 1 and the other resistors 2, 3 and 4 are adjusted such that they all have the same resistance when the pressure-sensitive resistor 1 is under a standard condition not subjected to a pressure to be measured. In other words, the voltage difference between the two voltage measurement points 8 and 9 is nearly zero under such a normal condition and hence the voltage measured by the voltage measuring circuit 7 is also zero.

When the pressure-sensitive resistor 1 is subjected to a pressure, it undergoes a strain due to the applied pressure. The pressure-sensitive resistor 1 is made of a material with the property of changing its resistance when strained. As the resistance of the pressure-sensitive resistor 1 changes due to a change in pressure, a non-zero voltage difference appears between the measurement points 8 and 9 and this voltage difference is inputted through the amplifier circuit 6 to the measurement circuit 7 and is thereby measured.

Although a pressure-sensitive resistor is connected with three other resistors as described above to form a pressure sensor, the resistance of a resistor is affected not only by pressure but also by other physical variables such as temperature and tension. Thus, if a resistor is used such that such other physical variables can be measured, it is possible to form detectors of such other physical variables such as a temperature detector and a strain gauge. Japanese Patent Publication Tokkai 9-236592 disclosed a resistor placed inside a sealed container used as a detector of thermal conductivity for a gas chromatograph by heating it, introducing a sample-containing gas into the container and making use of the fact that the temperature of the resistor changes according to the thermal conductivity of the gas.

One of the problems of prior art pressure sensors of the type described above was that the measured pressure varied, depending on the environmental temperature. In the pressure sensor described above with reference to FIG. 1, for example, the pressure-sensitive resistor 1 was used for detecting changes in a target gas but if the temperature of the target gas changes as well as its pressure, the change in resistance due to the change in pressure and that due to the change in temperature are superposed and hence the change in pressure could not be measured accurately. Moreover, the resistance of the pressure-sensitive resistor changes due to changes in temperature even if the pressure remains constant, giving rise to the phenomenon of drift in the output.

SUMMARY OF THE INVENTION

It is therefore an object of this invention to provide an improved bridge circuit and a sensor using such an improved bridge circuit with which the effect of drift due to changes in temperature can be eliminated and the changes in the physical variable originally intended to be measured can be accurately measured.

A bridge circuit embodying this invention, with which the above and other objects can be accomplished, may be characterize not only as comprising four resistors forming a Wheatstone bridge, one of the resistors being set at a position for measuring a desired physical variable and the bridge being adapted to output a voltage imbalance due to a change in the physical variable, but also as being provided with voltage measuring means for measuring the voltage differences between the two pairs of mutually opposite junctions of the resistors forming the Wheatstone bridge and a means for calculating the effects of temperature from these measured voltage differences to make a correction.

BRIEF DESCRIPTION OF THE DRAWINGS

The accompanying drawings, which are incorporated in and form a part of this specification, illustrate an embodiment of the invention and, together with the description, serve to explain the principles of the invention. In the drawings:

FIG. 1 is a block diagram of a prior art bridge circuit; and

FIG. 2 is a block diagram of a bridge circuit embodying this invention.

DETAILED DESCRIPTION OF THE INVENTION

FIG. 2 shows an example of bridge circuit embodying this invention serving as a part of a pressure sensor. Components which are like or equivalent to those described above with reference to FIG. 1 are indicated by the same numerals for convenience. Thus, numeral 1 indicates a pressure-sensitive resistor, numerals 2, 3 and 4 are resistors which form a bridge circuit together with the pressure-sensitive resistor 1, numeral 5 indicates a constant current circuit and numeral 6 indicates an amplifier circuit 6. Numeral 7 indicates a voltage measuring circuit herein referred to as the "first voltage measuring circuit" because numeral 11 indicates what is herein referred to as the "second voltage measuring circuit". For reference, the junction between the resistors 3 and 4 is indicated by numeral 8 and is referred to as the second junction, the junction between the resistors 1 and 2 is indicated by numeral 9 and referred as to the first junction, the grounded junction between the resistors 2 and 3 is indicated by numeral 20 and is referred to as the fourth junction, and the junction between the resistors 1 and 4, at which the second voltage measuring circuit 11 is connected to the bridge circuit, is indicated by numeral 10 and is referred to as the third junction. For the convenience of explanation, furthermore, the series connection of the resistors 1 and 4 with the third junction 10 in between will be herein referred to as the first resistor group 14 and the series connection of the resistors 2 and 3 with the fourth junction 20 in between will be herein referred to as the second resistor group 23, the first resistor group 14 and the second resistor group 23 being conneced in parallel between the first junction 9 and the secon juntion 8. Numeral 12 indicates a microcomputer connected to both the first and second voltage measuring circuits 7 and 11. In summary, the circuit shown in FIG. 2 is different from the prior art circuit shown in FIG. 1 only wherein the second voltage measuring circuit 11 for measuring the voltage at the junction 10 and the microcomputer 12 for carrying out various calculations, to be described below, are additionally provided.

As explained above with reference to FIG. 1, the constant current circuit 5 serves to pass a constant current of several mA through the bridge formed by the resistors 1, 2, 3 and 4, the voltage difference between the junctions 8 and 9 is amplified by the amplifier circuit 6 and detected by the first voltage measuring circuit 7. The pressure-sensitive resistor 1 and the other resistors 2, 3 and 4 are designed such that they all have the same resistance when the pressure-sensitive resistor 1 is not subjected to any pressure to be measured but there may be differences due to variations at the time of their production. Let us consider a situation, for example, where the resistance of resistors 1, 3 and 4 is R but that of resistor 2 is R+r. If the total current passed by the constant current circuit 5 is I, the current which flows through the branch with resistors 1 and 2 is $i_1$ and that flows through the other branch with resistors 3 and 4 is $i_2$, the following equations hold: $I=i_1+i_2$ and $i_1(R+R+r)=i_2(R+R)$, while the voltage difference $\Delta V$ between the junctions 8 and 9 is given by $\Delta V=i_1(R+r)-i_2 R$. Eliminating $i_1$ and $i_2$ from these three equations, one obtains:

$$\Delta V = RrI/(4R+r) \quad (1)$$

Suppose that the environmental temperature has changed such that the resistance of each of the bridge resistors 1, 2, 3 and 4 has increased by a same factor k, or that they each became (1+k) times as large as the original resistance value. Under this condition, the voltage difference $\Delta V_1$ between junctions 8 and 9 is given by:

$$\Delta V_1 = (1+k)RrI/(4R+r) \quad (2)$$

Thus, the change in the voltage difference before and after the rise in the temperature is given as follows:

$$\Delta\Delta V = \Delta V_1 - \Delta V = kRrI/(4R+r) \quad (3)$$

In other words, the drift in the output due to the change in environmental temperature is $\Delta\Delta V=kRrI/(4R+r)$.

According to the present invention, the voltage $V_{10}$ at junction 10 (or the voltage difference between the junction 10 and the grounded fourth junction 20 between the resistors 2 and 3) is measured by the second voltage measuring circuit 11. It is easy to calculate that this voltage $V_{10}$ is given by the following expression:

$$V_{10} = 2IR(2R+r)/(4R+r) \quad (4)$$

Thus, one can easily ascertain from (2) and (4) that $V_{10}$ and $\Delta\Delta V$ are in a mutually proportional relationship. In other words, if the voltage $V_{10}$ at junction 10 is measured, the value of $\Delta\Delta V$ can be predicted by means of the microcomputer 12. The output voltage difference $\Delta V_1$ measured by the first voltage measuring circuit 7 can thus be corrected to obtain the value of $\Delta V$.

In practice, the values of $V_{10}$ and $\Delta\Delta V$ are preliminarily measured at two different temperatures and the proportionality constant therebetween obtained by the measurements is stored in the microcomputer 12. In subsequent occasions, this stored proportionality constant is retrieved to correct the effects of temperature changes.

Although the invention was described above by way of an example wherein a bridge circuit embodying the invention is used as a pressure sensor, it goes without saying that an application can be made equally well to detectors of different kinds such as detectors of thermal conductivity, strain gauges and vacuum gauge.

A bridge circuit embodying this invention may be more generally described as comprising a Wheatstone bridge circuit with a first series connection of a first resistor and a second resistor and a second series connection of a third resistor and a fourth resistor, where the first series connection and the second series connection are connected in parallel, a constant current source for passing a constant current between the junctions of this parallel connection, a first voltage measuring circuit for measuring the voltage difference between the junction between the first and second resistors and the junction between the third and fourth resistors, a second voltage measuring circuit for measuring the voltage at one of the junctions of the parallel connection and a means for correcting the voltage difference measured by the first voltage measuring circuit by the voltage value measured by the second voltage measuring circuit.

According to a preferred embodiment of the invention where the bridge circuit as described above is used as a detector, one of the resistors forming a Wheatstone bridge may be provided with a means for attaching to an object of measurement such that specified physical characteristics of the target object can be detected properly. When the bridge circuit is used to measure a gas pressure, one of the resistors is enclosed inside a sealed container, as described above, with a means for introducing the target gas into such a sealed container.

In summary, a bridge circuit according to this invention is advantageous in that a stable output with little drift can be obtained in spite of variations in the environmental temperature.

What is claimed is:

1. A bridge circuit comprising:
   a wheatstone bridge consisting of a first resistor group and a second resistor group connected in parallel between a first junction point and a second junction point, said first resistor group consisting of a first resistor and a second resistor connected in series with the third junction point therebetween, said second resistor group consisting of a third resistor and a fourth resistor connected in series with a fourth junction point therebetween;
   a first voltage measuring means for measuring and outputting $\Delta V$ representing a voltage difference between said first junction point and said second junction point;
   a second voltage measuring means for measuring and outputting $V_{10}$ which represents a voltage difference between said third junction point and said fourth junction which are diagonal junction points of said wheatstone bridge;
   a calculating means for calculating from said $V_{10}$ a correction value by which said $\Delta V$ must be changes for drift correction corresponding to a change is an environmental condition; and a constant current circuit which is connected to said third junction point and serves to cause a constant current to pass through said wheatstone bridge.

2. The bridge circuit 1 wherein said calculating means stores a proportionality constant characterizing a proportionality relationship between said correction and said voltage value at said third junction point.

3. The bridge circuit of claim 2 wherein said proportionality constant is calculated form said correction value and said $V_{10}$ at two different temperatures.

4. The bridge circuit of claim 1 wherein said first resistor changes resistance according to environmental temperature.

5. The bridge circuit of claim 1 wherein said first resistor changes resistance according to tensile force thereon.

6. The bridge circuit of claim 1 wherein said environment condition is environmental temperature.

7. The bridge circuit of claim 1 wherein resistance of each said first resistors, said second resistor, said third resistor and said fourth resistor increases by a same factor by a change in environmental temperature.

* * * * *